United States Patent [19]

Hill

[11] Patent Number: 5,056,033
[45] Date of Patent: Oct. 8, 1991

[54] MICROPROCESSOR EMULATOR ACTIVE PROBE POWER SUPPLY

[75] Inventor: Charles P. Hill, Colorado Springs, Colo.

[73] Assignee: Hewlett-Packard Company, Palo Alto, Calif.

[21] Appl. No.: 557,256

[22] Filed: Jul. 24, 1990

[51] Int. Cl.$^5$ .............................................. G01R 19/00
[52] U.S. Cl. .................................... 364/483; 371/16.2
[58] Field of Search .............. 364/483; 371/16.2, 22.1, 371/21.1; 363/65

[56] References Cited

U.S. PATENT DOCUMENTS

| | | | |
|---|---|---|---|
| 4,517,512 | 5/1985 | Petrich et al. | 371/22.1 |
| 4,788,683 | 1/1988 | Hester et al. | 371/21.1 |
| 4,879,661 | 11/1989 | Olsen | 364/483 |

FOREIGN PATENT DOCUMENTS 59-168553  9/1984  Japan ................................ 371/16.2

Primary Examiner—Salvatore Cangialosi

[57] ABSTRACT

The active probe power supply uses isolated voltage sensing which powers the active probe from a power supply which uses the system under test power supply in a reference. This power supply interconnection arrangement makes use of Schottky diodes to interconnect the power supply leads of both systems. These diodes turn on quickly to eliminate the potential damage when a shorting fault occurs in either the emulator or the system under test. Furthermore, these diodes behave as capacitors when the power supply voltages are equal to provide high frequency grounding and to maintain a common logic 1 level to provide maximum noise margin. These diodes also introduce a significant impedance in the power supply control loop thereby avoiding loop instability and timing variations due to load driving.

18 Claims, 1 Drawing Sheet

MICROPROCESSOR EMULATOR ACTIVE PROBE POWER SUPPLY

FIELD OF THE INVENTION

This invention relates to emulator circuits and, in particular, to a power supply arrangement for an active probe that emulates a microprocessor.

PROBLEM

It is a problem in the field of test apparatus to match the speeds of the microprocessors that are emulated by the test apparatus and concurrently avoid damaging the test apparatus emulator probe and the system under test due to power supply differentials. A microprocessor emulator is a test tool used in test apparatus that is substituted for the microprocessor in a system under test and which functions to mimic the action of the replaced microprocessor while providing the user with improved testing capability. Presently available test apparatus microprocessor emulators make use of passive probes wherein the probe functions to simply extend the leads of the replaced microprocessor in the system under test to the test apparatus. However, as processor speeds increase, these passive probes cannot meet the speed requirements of the system under test due to the signal delay caused by the need to drive the cable that interconnects the test apparatus microprocessor emulator with the system under test.

The passive probe of the microprocessor emulator and the system under test must operate in a manner where neither is damaged by the operation of the other. This is most difficult to achieve during power up and power down conditions since both the microprocessor emulator and the system under test are powered from different power supplies. These power supplies cannot be directly connected together and cannot be turned on and off at exactly the same time. Furthermore, these power supplies each operate within a predetermined output voltage tolerance range and can provide a fairly significant output voltage differential therebetween. When an emulator is connected to a system under test, and one power supply is on and the other is off, the signal leads, which interconnect the emulator and the system under test, supply power to the components in the system whose power supply is off. This can cause problems in both the emulator and the system under test since a number of different failure mechanisms arise when components are powered through their signal leads. First, the maximum input current on the device signal lead can be exceeded, which can cause excessive local power dissipation. Secondly, the signal lead input current can cause a phenomenon called "latchup" when power is first applied to a particular device. All devices that are fabricated in integrated circuit form include parasitic transistors to the substrate on which these devices are formed. These parasitic transistors are not part of the normal functioning of the device but are turned on when current is applied to the device through the signal leads when the power supply associated with the device is turned off. Deactivation of these parasitic transistors in this manner shorts the device power supply lead to ground and when the device power supply is subsequently turned on, excessive power dissipation can occur causing catastrophic damage to the device. Thirdly, the device that is supplying current over the signal leads to the devices that are powered off can be overdriven by providing a current to the signal leads which exceeds its maximum allowable output current, thereby damaging these devices.

These problems in passive probes are typically addressed by designing the emulator components such that they do not conduct current into their inputs when powered off. These devices in the emulator also do not have clamp diodes to the power supply which prevents output current on the system under test components from being exceeded. Furthermore, the system under test is powered up first and the emulator is never powered on while the system under test is powered down. However, this is subject to human error and is an unreliable solution to this problem.

The further drawback of passive probe technology is the loss of noise margin in the logic level "1". The noise margin is a measure of the noise immunity in a digital system. Since the power supplies of the emulator and the system under test are independent of each other, both can operate at some variation from their nominal voltages, thereby causing a voltage differential between the emulator and the system under test. This voltage differential affects the digital logic 1 voltages in each system. This difference in the level used in the emulator and system under test for a logic 1 reduces the noise margin since the lower of the two power supply voltages establishes a maximum logic 1 value that can reliably be measured by the emulator system. The logic level 0 noise margin is not affected since, typically, the emulator and the system under test have their ground leads interconnected thereby sharing a common logic level 0 potential. However, a certain amount of logic level 0 degradation can occur if the leads interconnecting emulator with the system under test are excessively long, thereby creating a ground loop through the lead impedance. However, this problem is less significant than the above-mentioned problems.

SOLUTION

The above-described problems are solved and a technical advance achieved in the field by the power supply for a microprocessor emulator active probe of the present invention. This apparatus overcomes the problems of prior art passive probes by making use of an active probe which contain a microprocessor identical to that removed from the system under test and which is being emulated within the probe itself. The presence of the emulator microprocessor in the probe itself eliminates the processor speed limitations of passive probes. A power supply arrangement is provided for the microprocessor emulator active probe to avoid excessive currents in the signal leads which connect the emulator and the system under test as well as to overcome the loss in logic level 1 noise margin due to power supply variation between the emulator and the system under test. Furthermore, this power supply interconnection arrangement renders irrelevant the power on and off sequencing of the emulator and the system under test. This is accomplished by the use of isolated voltage sensing which powers the active probe from a power supply which uses the system under test power supply as a reference. This power supply interconnection arrangement makes use of Schottky diodes to interconnect the power supply leads of both systems. These diodes turn on quickly to eliminate the potential for device damage when a shorting fault occurs in either the emulator or the system under test. Furthermore, these diodes behave as capacitors when the power supply voltages are equal to provide high frequency grounding and to maintain a common logic 1 level to provide maximum noise margin. These diodes also are a large low frequency impedance in the power supply control loop thereby avoiding loop instability due to capacitive load driving.

DETAILED DESCRIPTION

Figure 1:
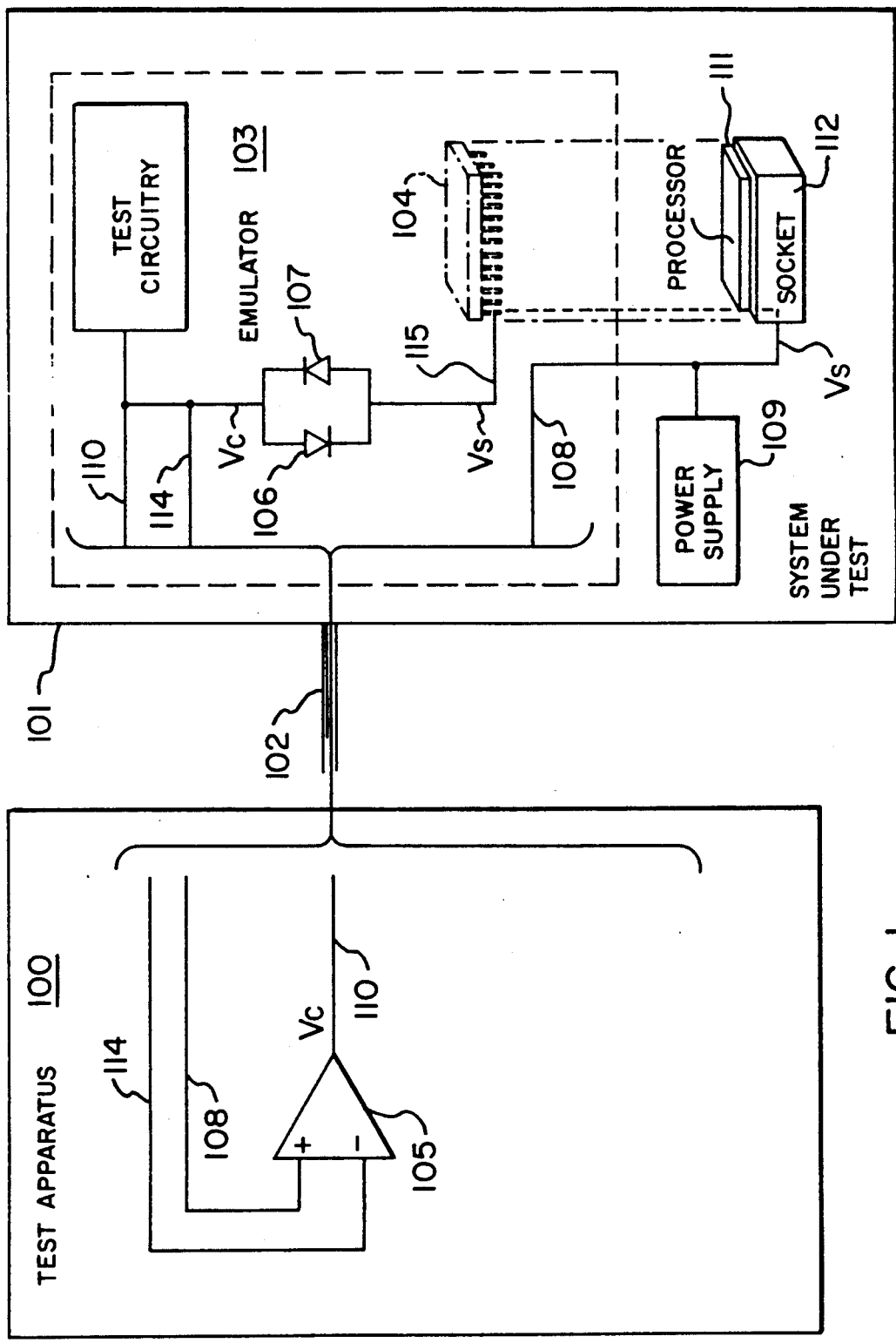
FIG. 1 illustrates the microprocessor emulator active probe power supply in block diagram form.

FIG. 1 illustrates in block diagram form the architecture of the microprocessor emulator active probe power supply apparatus of the present invention. A test apparatus 100 is interconnected with a microprocessor controlled system under test 101 via a set of cables 102. Interconnection of the test apparatus 100 and the system under test 101 is such that the microprocessor 111 in the system under test 101 is replaced by active probe 103 which functions in the same manner as the microprocessor 111 removed from the system under test 101. Typically, active probe 103 plugs into the connector 112 in which microprocessor 111 is normally installed in system under test 101. Cable 102 interconnects the active probe 103 with test apparatus 100 to carry signals therebetween and to provide power to active probe 103 from test apparatus 100. Active probe 103 includes either a microprocessor 104 that is the same device as microprocessor 111 or a device that can emulate the operation of microprocessor 111 so that microprocessor 104 executes the program instructions in system under test 101 in transparent fashion. The signals transported by cable 102 to test apparatus 100 are used to monitor and control step-by-step program execution of microprocessor 104. Test apparatus 100 typically includes a computer (not shown) that is equipped with a keyboard and a video monitor. The function of the computer and additional circuitry found in test apparatus 100 is to record the sequence of program instruction operations executed by microprocessor 104 and system under test 101. The function of the additional circuitry in test apparatus 100, as well as the software in computer, is well known and is not disclosed in detail herein. What is important to note at this point is that active probe 103 is powered by a power supply 105 in test apparatus 100 via cable 102.

Active probe 103 includes a microprocessor 104 which is the same as or identically emulates the function of microprocessor 111 in system under test 101. The microprocessor 104 is placed in active probe 103 due to the speed of operation of microprocessor 111. In order to function at the speeds required for microprocessor 111, the microprocessor 104 in active probe 103 must be physically located at connector 112 because the impedance of the cable 102 would cause signal propagation delays of such magnitude as to distort the functioning of system under test 101. Therefore, a microprocessor 104 must be included in active probe 10 in order to effectively emulate the operation of microprocessor 111 in system under test 101.

Signal Lead Current Limiting Resistors

One method of avoiding the problems of latchup and excessive power dissipation on the inputs and outputs of the microprocessor 104 in active probe 103, is to provide current limiting resistors in all of the signal leads which interconnect microprocessor 104 with system under test 101 to thereby limit the signal lead current. The maximum current ($I_{MAX}$) carried by a lead signal lead is determined by the supply voltage ($V_S$) and the resistance (R) of the signal lead, with this maximum current ($I_{MAX}$) being defined as the supply voltage ($V_S$) divided by the resistance (R) in the signal lead. This mechanism effectively and precisely limits the amount of current that is carried by the signal lead. However, a difficulty with this arrangement is that the insertion of a resistor in the signal lead also changes the timing of the signals carried on the signal lead by altering the RC time constant of the signal lead. The timing of digital systems without series resistance depends on the load capacitance, and the addition of a series resistance alters this timing. Without a series resistor, the integrated circuit acts as a current source during switching which slews the load capacitance. The timing variation with load capacitance is given by equation 1:

$$t_{dif} = (C/I)V_{dif}$$

The time differential ($t_{dif}$) is therefore a product of the voltage differential ($V_{dif}$) multiplied by the capacitance (C) which product is divided by the current (I) carried by the signal lead. When series current limiting resistors (R) are added to the signal lead, the timing variation with load capacitance (C) is given by the following equation 2:

$$t_{dif} = -RC \ln\left(1 - \frac{V_{dif}}{V_s}\right)$$

As can be seen from this equation, the timing differential is significantly different than the original timing differential of equation 1 above. In addition, the current in the signal lead must be limited to a value at which the device input currents and output currents cannot damage either system under test 101 or the circuitry within active probe 103. A significant difficulty with this limitation is that the system under test 101 contains components which vary widely in their specifications and are beyond the control of the engineers who design the test apparatus 100. Therefore, a reasonable maximum value of input current must be selected in order to determine a safe value for the current limiting resistor. If it is assumed that the maximum input current of a device is 20 mA, then the value of the current limiting resistor (R) is 250 Ohms, which is the typical supply voltage ($V_S$) of 5 volts divided by the 20 mA current. If the maximum output current of this same family of integrated circuits is 50 mA and a typical load capacitance is 50 pF, a time differential using a voltage differential of 2.4 volts in equation 1 above is 2.4 nS. The timing change with a 250 Ohm series current limiting resistor inserted, as given by equation 2 above, is then 8.17 nS. As can be seen, the series current limiting resistor (R) provides a safe input current level but significantly changes the timing differential on faster processors. Furthermore, the precise affect of the current limiting resistors is not predictable, since the values given above are for typical parameters found in an integrated circuit and integrated circuits within different families vary widely.

A final problem with the use of current limiting resistors is that, as in the case of passive probe emulators, the logic 1 noise margin is adversely affected by differences in the two power supply voltages. This lack of connection between the integrated circuit power supplies increases the high frequency noise since the interconnection of voltage supplies typically provide high frequency grounding for the integrated circuits. When the power supply leads are not connected from the system under test 101 to the active probe 103, the net impedance between the two systems is increased and noise across this impedance increases.

Output Control Of Active Probe

An alternative to the use of the signal lead current limiting resistors in the design of active probe 103 is to control deactivation of the outputs of all components on active probe 103. In addition, the user is required to power up the test apparatus 100 before the system under test 101 is activated. In this situation, the power applied to active probe 103 activates device protection circuitry contained therein, which device protection circuitry disables the outputs of all components on active probe 103 until the power is turned on in system under test 101, as detected by this device protector circuitry. As with the signal lead current limiting resistor situation above, this approach suffers from a degraded logic level 1 noise margin due to power supply mismatch and the degraded high frequency grounding caused by lack of connection of the power pins between the system under test 101 and active probe 103. Furthermore, all components on active probe 103 must not have clamp diodes to the power supply on their inputs. This is to prevent system under test 101 from driving current into these diodes when the two power supplies are mismatched such that the power supply in system under test 101 is higher in value than the power supply 105 in test apparatus 100 which supplies power to active probe 103. This is a difficult problem since most components do use clamp diodes on their outputs.

Power Supply Voltage Sensor For Active Probes

One solution to the problem of degraded logic 1 levels due to voltage mismatch between the power supplies of system under test 101 and test apparatus 100 and the problem of current sourcing into the clamp diodes is to add a controlled power supply 105 to test apparatus 100 which controlled power supply 105 provides the voltage for the circuitry on active probe 103. This controlled power supply 105 matches the probe power supply voltage to the power supply voltage produced by power supply 109 of system under test 101. These two power supplies are not connected together so there is high frequency grounding signal degradation and test apparatus 100 must be powered up first and powered down last to avoid excessive signal currents since its controlled power supply 105 is operating as a function of the power supply 109 in system under test 101.

Power Supply Current Sensing For Active Probes

To resolve the problem of excessive voltage differential between system under test 101 and test apparatus 100, an impedance is inserted between the power supply leads 115 of system under test 101 and the sensing lead 114 for the controlled power supply 105 in test apparatus 100. This impedance prevents a large difference in voltage from occurring and it alleviates the noise margin degradation relating to poor high frequency grounding. Also, this impedance provides a current limiting function such that active probe 103 can be powered from the power supply 109 of system under test 101 until the controlled power supply 105 in test apparatus 100 is turned on. This impedance therefore solves most of the problems encountered in prior test apparatus systems and especially the need to sequence the powering of the system under test 101 and test apparatus 100. One difficulty with the use of an impedance, such as a resistor, in this configuration is that the control loop for the controlled power supply 105 is now a current sensing control loop and the loop tends to drive the current in the sense resistor to zero. If there are errors in this control loop, the active probe 103 could actually be supplying power into system under test 101 and therefore the control loop of the controlled power supply 105 must be a precision circuit to avoid this situation. A more significant problem is that the current sense resistor and any bypass capacitors form a pole in the closed loop frequency response of the probe power supply and therefore can cause instability since the bypass capacitors which are located in the system under test 101 are beyond the control of the designer of the active probe 103 and cannot be anticipated.

Isolated Voltage Sense For Active Probe

An improved method of accomplishing the results of the above-described power supply current sensing for active probes is to replace the impedance in the power supply interconnection with a pair of parallel connected diodes 106, 107 which are inserted between the power supply lead $V_S$ of system under test 101 and the power supply lead $V_C$ of test apparatus 100. This configuration matches the performance of the voltage sense arrangement disclosed above during steady state conditions, avoids the stability problem of the current sense scheme described above and has the advantage of the current sense scheme when the power supply voltage differential is significant. It therefore retains the best results of both solutions. If the parallel connected diodes are power Schottky diodes, then the voltage drop across these diodes is 0.3 volts which is well below a voltage difference which causes excessive signal current levels between the power supplies of the system under test 101 and test apparatus 100. When the power supplies of both system under test 101 and test apparatus are at the same voltage level, these parallel connected diodes 106, 107 behave as capacitors which provide high frequency grounding between the connected power supplies to maintain a significant noise margin for the logic 1 level. These diodes 106, 107 turn on very quickly, thereby eliminating the potential for damage when a shorting fault occurs either on system under test 101 or test apparatus 100.

Active Probe Power supply

The power supply 105 of test apparatus 100 is a remote sense, remote reference power supply of a type that is well known in the art. The + input of power supply 105 is the reference input which is connected via lead 108 to the power supply 109 output lead $V_S$ of system under test 101. The − input of power supply 105 is the sense lead input and constitutes a feedback path which is used by power supply 105 to monitor, via lead 114, the actual voltage at the test circuitry 116 power input lead 115 in probe 103. Power supply 105 varies its output voltage $V_C$ to have the voltage at the sense input match the voltage on the reference input. The negative feedback through the sense input of power supply 105 nullifies the effects of the cable resistance 108 of the leads of cable 102. The output voltage $V_C$ produced by power supply 105 is of magnitude to cause the voltage applied via lead 110 to test circuitry 116 to match the voltage $V_S$ produced by power supply 109. In addition, there is no current flow through diodes 106, 107 when the voltage differential across diodes 106, 107 is less than their forward breakdown voltage. If there is a voltage differential across diodes 106, 107 greater than the forward breakdown voltage, the diode so biased conducts. Therefore, when diode 106 conducts, system under test 101 supplies power from power supply 109 lead $V_S$ through diode 106 to microprocessor 104 in active probe 103. Diodes 106, 107 conduct rapidly (less than 1 ns) and maintain continuity of power to active probe 103 until power supply 105 responds to a voltage differential across its reference and sense inputs to vary the output voltage on power supply lead $V_C$ to thereby cause the voltage applied to microprocessor 104 power output lead 115 to match the voltage output by power supply 109 on lead $V_S$.

While a specific embodiment of this invention has been disclosed, it is expected that those skilled in the art can and will design alternate embodiments of this invention that fall within the scope of the appended claims. For example, this apparatus can be used in the interconnection of any two systems which have individual power supplies and devices which drive the signal leads which interconnect these two systems. The signal lead drivers and receivers can be equipped with diodes 106, 107 to provide the isolated voltage sensing for controlled power supply 105 located in one of the systems and to provide continuity of power to these devices if one of the systems is powered off while the other system is powered on.

I claim:

1. Apparatus for controlling a voltage output by a power supply in a first system as a function of a second system having a power supply which applies a voltage of predetermined magnitude to a power supply lead in said second system, comprising:
   means having sense and reference inputs and an output for generating a voltage at said output identical to the voltage appearing on said reference input;
   means for interconnecting said reference input to said power lead in said second system;
   means for applying said output to at least one signal lead that is connected to said second system;
   means for interconnecting said signal lead at a point where it connects to said second system, with said sense input;
   means for providing a feedback path between said voltage lead and said signal lead at said point where said signal lead connects to said second system.

2. The apparatus of claim 1 wherein said generating means comprises a remote sense, remote reference power supply.

3. The apparatus of claim 1 wherein said feedback means includes:
   means for enabling a current flow from said voltage lead to said signal lead when said voltage of predetermined magnitude is greater than said voltage on said signal lead by greater than a predetermined threshold voltage.

4. The apparatus of claim 3 wherein said enabling means includes:
   a first diode, having an anode and a cathode, with said anode connected to said voltage lead and said cathode connected to said signal lead and having a forward breakdown voltage equal to said predetermined threshold voltage.

5. The apparatus of claim 3 wherein said feedback means further includes:
   means for switchably conducting current from said signal lead to said voltage lead when said voltage on said signal lead is greater than said voltage of predetermined magnitude by greater than a predetermined threshold voltage.

6. The apparatus of claim 5 wherein said conducting means includes:
   a second diode, having an anode and a cathode, with said anode connected to said signal lead and said cathode connected to said voltage lead and having a forward breakdown voltage equal to said predetermined threshold voltage.

7. In a test system, which is connected to a system under test which is controlled by an application processor via data, address and control buses and which includes a power supply which produces a voltage output of predetermined magnitude, power supply regulation apparatus in said test system for providing power to an active probe which is connected to said test system by a cable and which is directly connectable to said data, address and control buses in said system under test, comprising:
   means having sense and reference inputs and an output for generating a voltage at said output identical to the voltage appearing on said reference input;
   means for interconnecting said reference input to said voltage output;
   means for applying said output to a power supply input of at least one device in said active probe that drives said data, address and control buses;
   means for interconnecting said power supply input with said sense input in said active probe;
   means for providing a feedback path between said voltage lead and said power supply input in said active probe.

8. The apparatus of claim 7 wherein said generating means comprises a remote sense, remote reference power supply.

9. The apparatus of claim 7 wherein said feedback means includes:
   means for enabling a current flow from said voltage lead to said signal lead when said voltage of predetermined magnitude is greater than said voltage on said signal lead by greater than a predetermined threshold voltage.

10. The apparatus of claim 9 wherein said enabling means includes:
    a first diode, having an anode and a cathode, with said anode connected to said voltage lead and said cathode connected to said signal lead and having a forward breakdown voltage equal to said predetermined threshold voltage.

11. The apparatus of claim 9 wherein said feedback means further includes:
    means for switchably conducting current from said signal lead to said voltage lead when said voltage on said signal lead is greater than said voltage of predetermined magnitude by greater than a predetermined threshold voltage.

12. The apparatus of claim 11 wherein said conducting means includes:
    a second diode, having an anode and a cathode, with said anode connected to said signal lead and said cathode connected to said voltage lead and having a forward breakdown voltage equal to said predetermined threshold voltage.

13. In a test system, which is connected to a system under test which is controlled by an application processor via data, address and control buses and which includes a power supply which produces a voltage output of predetermined magnitude, power supply regulation apparatus in said test system for providing power to an active probe which is connected to said test system by a cable and which includes a test processor directly connectable to said data address and control buses in said system under test, comprising:

means having sense and reference inputs and an output for generating a voltage at said output identical to the voltage appearing on said reference input;

means for interconnecting said reference input to said voltage output;

means for applying said output to a power supply input of said test processor, located in said active probe;

means for interconnecting said power supply input with said sense input in said active probe;

means for providing a feedback path between said voltage lead and said power supply input in said active probe.

14. The apparatus of claim 13 wherein said generating means comprises a remote sense, remote reference power supply.

15. The apparatus of claim 13 wherein said feedback means includes:

means for enabling a current flow from said voltage lead to said signal lead when said voltage of predetermined magnitude is greater than said voltage on said signal lead by greater than a predetermined threshold voltage.

16. The apparatus of claim 15 wherein said enabling means includes:

a first diode, having an anode and a cathode, with said anode connected to said voltage lead and said cathode connected to said signal lead and having a forward breakdown voltage equal to said predetermined threshold voltage.

17. The apparatus of claim 15 wherein said feedback means further includes:

means for switchably conducting current from said signal lead to said voltage lead when said voltage on said signal lead is greater than said voltage of predetermined magnitude by greater than a predetermined threshold voltage.

18. The apparatus of claim 17 wherein said conducting means includes:

a second diode, having an anode and a cathode, with said anode connected to said signal lead and said cathode connected to said voltage lead and having a forward breakdown voltage equal to said predetermined threshold voltage.

* * * * *